United States Patent
Lee et al.

(10) Patent No.: US 11,991,818 B2
(45) Date of Patent: May 21, 2024

(54) ELECTRONIC DEVICE AND GROUNDING STRUCTURE THEREOF

(71) Applicant: Delta Electronics, Inc., Taoyuan (TW)

(72) Inventors: Jui-Ching Lee, Taoyuan (TW); Po-Heng Chao, Taoyuan (TW); Do Chen, Taoyuan (TW); Ching-Ho Chou, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/720,069

(22) Filed: Apr. 13, 2022

(65) Prior Publication Data

US 2023/0232526 A1    Jul. 20, 2023

(30) Foreign Application Priority Data

Jan. 18, 2022 (CN) .......................... 202210055605.5

(51) Int. Cl.
*H05K 1/02* (2006.01)
*H05K 7/12* (2006.01)
*H05K 7/14* (2006.01)

(52) U.S. Cl.
CPC ............. *H05K 1/0215* (2013.01); *H05K 7/12* (2013.01); *H05K 7/1417* (2013.01)

(58) Field of Classification Search
CPC ...... H05K 1/0215; H05K 7/12; H05K 7/1417; H05K 1/111; H05K 1/117; H05K 3/325; H05K 7/142; H05K 7/1431; H05K 7/1452

See application file for complete search history.

(56) References Cited

U.S. PATENT DOCUMENTS

| | | | |
|---|---|---|---|
| 6,319,018 B1* | 11/2001 | Daoud ................ | H05K 1/0215 439/65 |
| 10,756,592 B2* | 8/2020 | Mezger ................ | H02K 11/33 |
| 2007/0152697 A1* | 7/2007 | Hsu ..................... | H05K 1/0215 324/763.01 |

FOREIGN PATENT DOCUMENTS

| | | |
|---|---|---|
| CN | 2852612 Y | 12/2006 |
| TW | 379469 B | 1/2000 |

* cited by examiner

*Primary Examiner* — James Wu
(74) *Attorney, Agent, or Firm* — KIRTON McCONKIE; Evan R. Witt

(57) ABSTRACT

An electronic device is provided and includes a circuit board and a casing. The circuit board includes a plate body, a perforation and a ground wire. The perforation penetrates through the plate body, the ground wire is electrically coupled with the plate body and crosses over the perforation. The casing includes a bottom plate and a clamping structure. The clamping structure is disposed on the bottom plate and includes a first clamping part and a second clamping part. The circuit board is disposed in the casing, and the clamping structure penetrates through the plate body through the perforation, so that the circuit board is positioned on the casing, and the ground wire is clamped by the first clamping part and the second clamping part of the clamping structure. Consequently, the circuit board is grounded with the casing.

20 Claims, 12 Drawing Sheets

ELECTRONIC DEVICE AND GROUNDING STRUCTURE THEREOF

CROSS-REFERENCE TO RELATED APPLICATION

This application claims priority to China Patent Application No. 202210055605.5, filed on Jan. 18, 2022. The entire contents of the above-mentioned patent applications are incorporated herein by reference for all purposes.

FIELD OF THE INVENTION

The present disclosure relates to an electronic device, and more particularly to an electronic device having a grounding structure which can be rapidly assembled and grounded. The present disclosure also relates to a grounding structure of the electronic device.

BACKGROUND OF THE INVENTION

Generally, if a circuit board of a known electronic device is required to ground with a metal casing, screws are usually used to fix one end of ground wire or ground terminal on the circuit board, and fix the other end of the ground wire or the ground terminal on the metal casing, so as to achieve grounding. However, using the screws, the ground wire or the ground terminal to perform the grounding have high cost, and the assembly process is time-consuming.

Some conventional electronic devices achieve grounding by riveting a grounding element to the circuit board and the metal casing. However, riveting fixtures are required to rivet the grounding element to the circuit board and the metal casing, the assembly process is time-consuming. Some other conventional electronic devices achieve grounding by using elastic sheets to be fixed between the circuit board and the metal casing. However, the material of the elastic sheets is prone to elastic fatigue, which may cause loosening.

Besides, the screws, the riveting fixtures and the elastic sheets of the above-mentioned grounding method have no function of positioning the circuit board. An extra positioning device is necessary for positioning the circuit board on the metal casing. Consequently, the cost is increased, and the assembly process is complicated.

Therefore, there is a need of providing an electronic device and a grounding structure thereof to obviate the drawbacks encountered from the prior arts.

SUMMARY OF THE INVENTION

It is an object of the present disclosure to provide an electronic device and a grounding structure thereof for rapidly grounding and positioning the circuit board at the same time, so that the rapid assembly of the electronic device is achieved, and the advantages of reducing costs, saving assembly time and materials and preventing the components from being damaged or broken during the assembly process are achieved.

In accordance with an aspect of the present disclosure, there is provided an electronic device. The electronic device includes a circuit board and a casing. The circuit board includes a plate body, at least one perforation and at least one ground wire. The at least one perforation penetrates through the plate body. The at least one ground wire is electrically coupled with the plate body, and is disposed on and crosses over the at least one perforation. The casing includes a bottom plate, at least one clamping structure and an accommodating space. The at least one clamping structure is disposed on the bottom plate, and extended from the bottom plate toward the accommodating space. The at least one clamping structure comprises a first clamping part and a second clamping part, which are disposed apart from each other. The circuit board is disposed in the accommodating space of the casing, the at least one clamping structure of the casing penetrates through the plate body through the at least one perforation, so that the circuit board is positioned on the casing. The at least one ground wire is clamped by the first clamping part and the second clamping part of the at least one clamping structure, so that the circuit board is grounded with the casing.

In accordance with another aspect of the present disclosure, there is provided a grounding structure for an electronic device. The grounding structure includes a circuit board a bottom plate and a clamping structure. The circuit board includes a plate body, a perforation and a ground wire. The perforation penetrates through the plate body. The ground wire is electrically coupled with the plate body, and is disposed on and crosses over the perforation. The clamping structure is disposed on the bottom plate, and includes a first clamping part and a second clamping part, which are disposed apart from each other. The clamping structure penetrates through the plate body through the perforation, and the ground wire is clamped by the first clamping part and the second clamping part for grounding.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
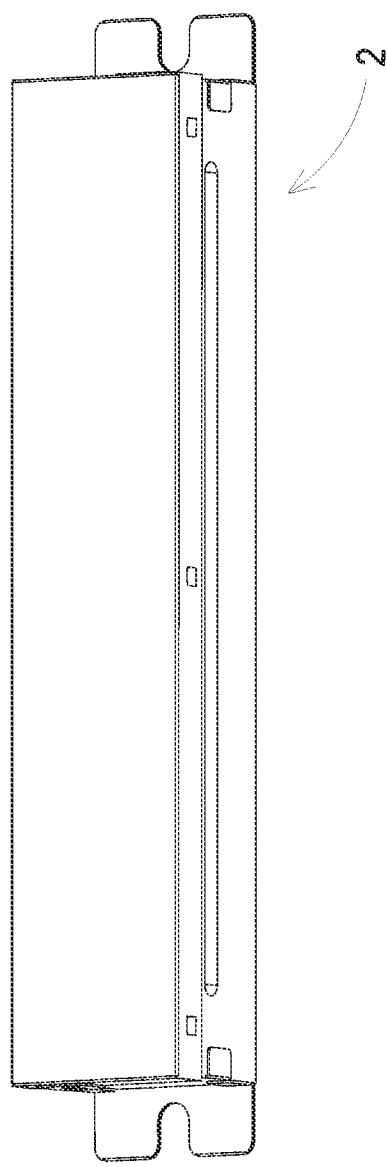
FIG. 1 is a schematic view showing an electronic device according to an embodiment of the present disclosure.
Figure 2:
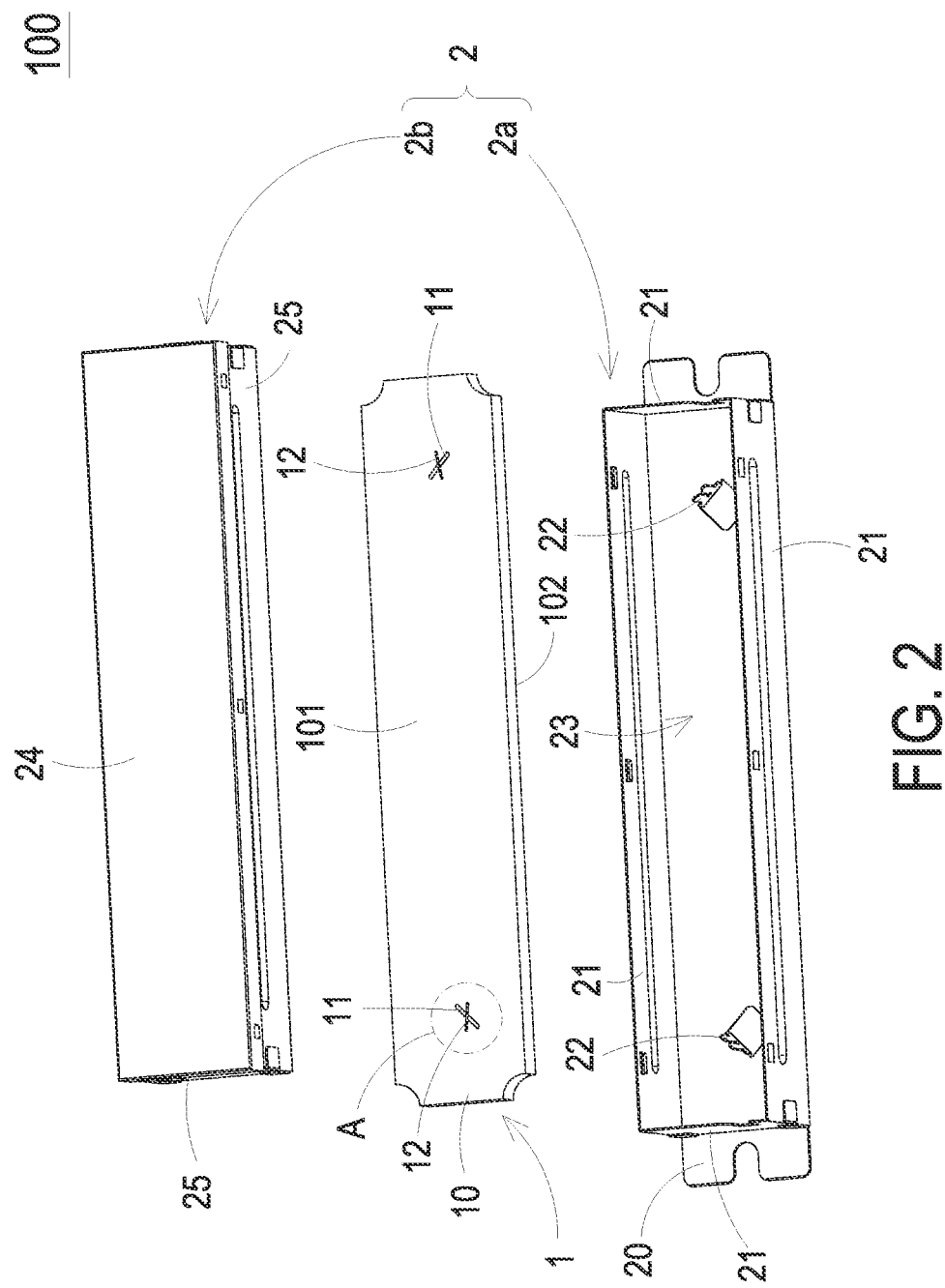
FIG. 2 is an explored view showing the electronic device of FIG. 1.
Figure 3:
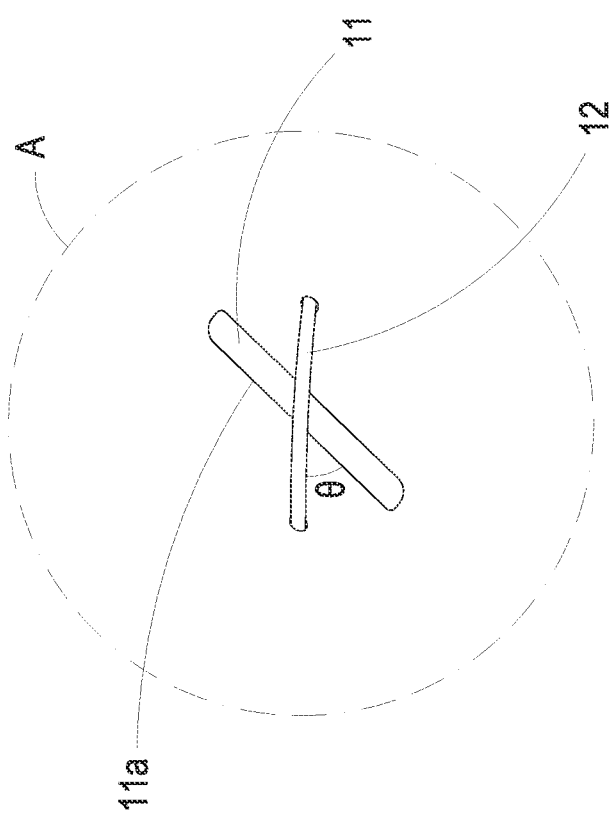
FIG. 3 is a partially enlarged view showing an area A of a circuit board of FIG. 2.
Figure 4:
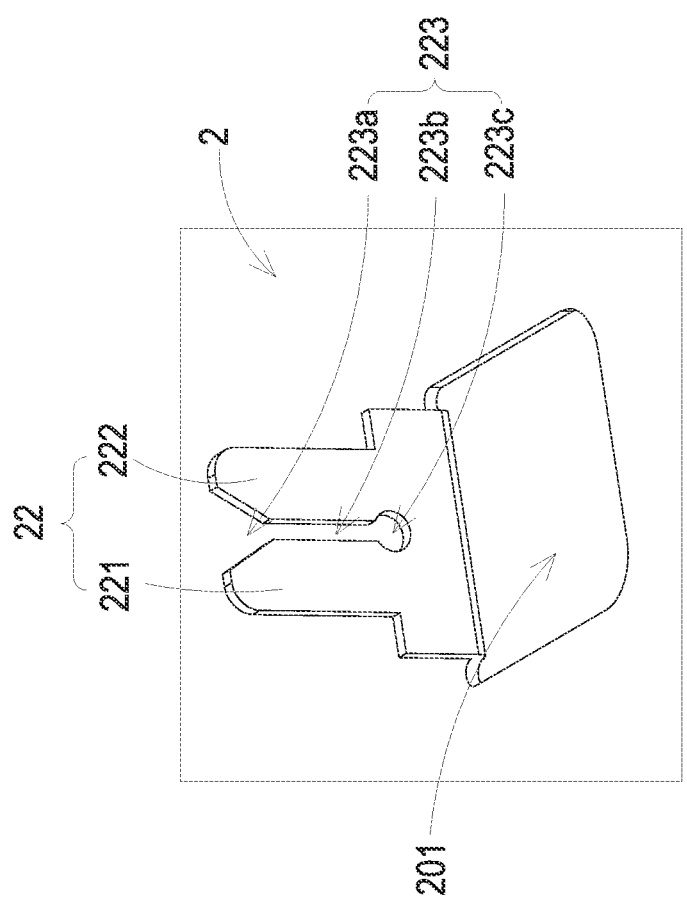
FIG. 4 is a schematic view showing a first exemplary clamping structure of the electronic device of FIG. 2.

FIG. 1 is a schematic view showing an electronic device according to an embodiment of the present disclosure, FIG. 2 is an explored view showing the electronic device of FIG. 1, FIG. 3 is a partially enlarged view showing an area A of a circuit board of FIG. 2, FIG. 4 is a schematic view showing a first exemplary clamping structure of the electronic device of FIG. 2. As shown in FIG. 1 to FIG. 4, the electronic device 100 includes a grounding structure for rapidly grounding and positioning the circuit board thereof. The electronic device 100 includes a circuit board 1 and a casing 2. The circuit board 1 includes a plate body 10, at least one perforation 11 and at least one ground wire 12. The at least one perforation 11 penetrates through the plate body 10. The at least one ground wire 12 is electrically coupled with the plate body 10, and is disposed on and crosses over the at least one perforation 11. The casing 2 includes a first casing part 2a and a second casing part 2b. The first casing part 2a is detachably assembled with the second casing part 2b. The first casing part 2a includes a bottom plate 20, a plurality of lateral plates 21, at least one clamping structure 22 and an accommodating space 23. The plurality of lateral plates 21 are respectively disposed adjacent to each other, and are respectively connected with the bottom plate 20, so as to form the accommodating space 23. The at least one clamping structure 22 is disposed on the bottom plate 20, and extended from the bottom plate 20 toward the accommodating space 23. Preferably but not exclusively, the at least one clamping structure 22 is perpendicular to the bottom plate 20. The at least one clamping structure 22 includes a first clamping part 221 and a second clamping part 222, which are disposed apart from each other. In the present embodiment, the circuit board 1, the bottom plate 20 and the clamping structure 22 are configured as the grounding structure of the electronic device 100.

Figure 5A:
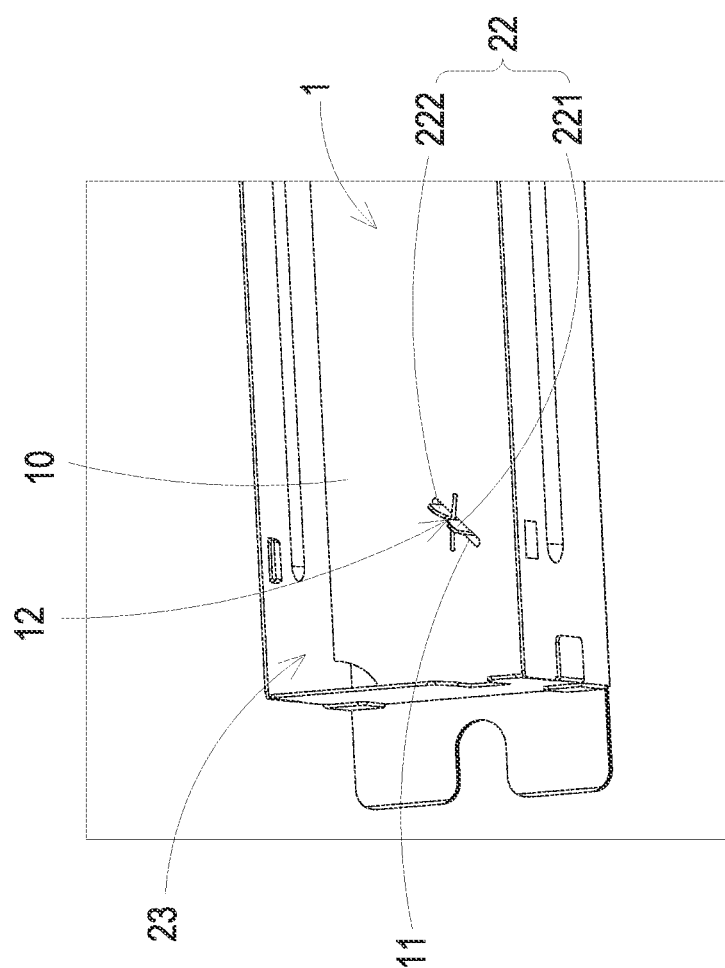
FIG. 5A is a partial schematic view showing the circuit board of the electronic device being assembled with the casing of FIG. 2.
Figure 5B:
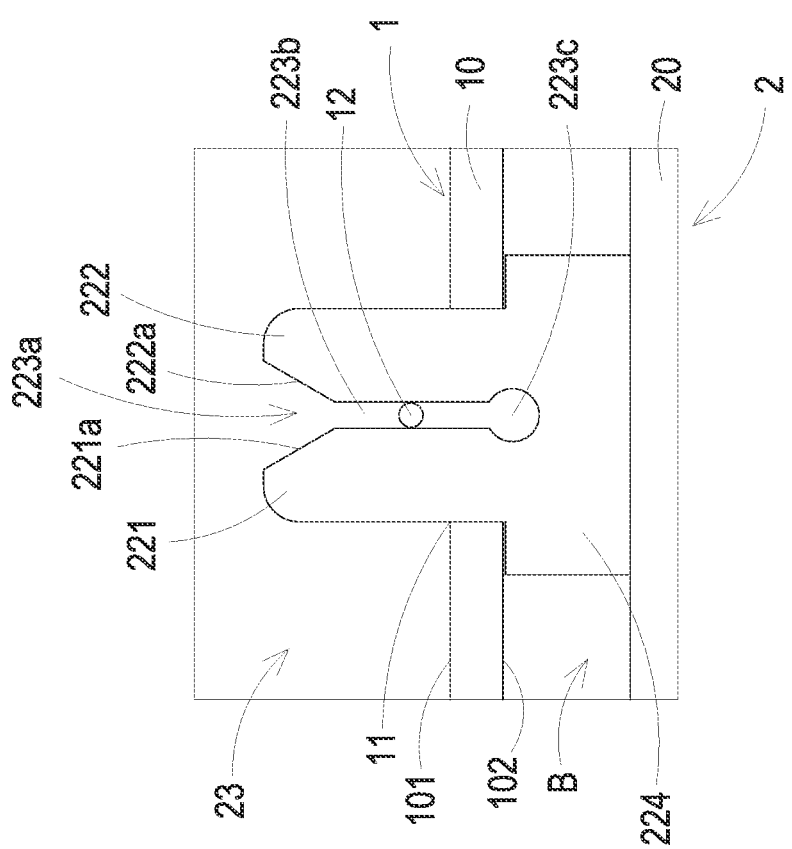
FIG. 5B is a cross-sectional view showing the circuit board being assembled with the casing of FIG. 2.

FIG. 5A is a partial schematic view showing the circuit board of the electronic device being assembled with the casing of FIG. 2, and FIG. 5B is a cross-sectional view showing the circuit board being assembled with the casing of FIG. 2. As shown in FIG. 5A and FIG. 5B, the circuit board 1 is disposed in the accommodating space 23 of the casing 2, the clamping structure 22 of the casing 2 penetrates through the plate body 10 through the perforation 11 of the circuit board 1, so that the circuit board 1 is positioned on the casing 2. In the meanwhile, the ground wire 12 is clamped by the first clamping part 221 and the second clamping part 222 of the clamping structure 22, so that the circuit board 1 is grounded with the casing 2. Therefore, by using the above-mentioned grounding structure, the circuit board 1 is rapidly grounded with and positioned on the casing 2, and the advantages of reducing costs and saving assembly time are achieved.

In an embodiment, the overall structure of the casing 2 is made of a metal material. In another embodiment, the clamping structure 22 and the bottom plate 20 are made of a metal material. By performing the push-down assembly operation, the ground wire 12 of the circuit board 1 is rapidly assembled with the clamping structure 22 which is made of a metal material. Consequently, the ground of the circuit board 1 is achieved.

In an embodiment, the clamping structure 22 of the casing 2 is formed by partial materials of the bottom plate 20 which is cut and bent toward the accommodating space 23, and an opening 201 is formed on the bottom plate 20. The clamping structure 22 is in connection with the bottom plate 20 and preferably in connected with a side of the opening 201. In other words, the clamping structure 22 and the bottom plate 20 are integrally formed into one-piece structure, so that the advantages of reducing costs and materials are achieved.

In the present disclosure, the numbers of the perforations 11, the ground wires 12 of the circuit board 1 and the clamping structures 22 of the casing 2 are the same. Preferably but not exclusively, the circuit board 1 includes two perforations 11 and two ground wires 12, and the casing 2 includes two clamping structures 22. The two perforations 11 are disposed on two opposite sides of the circuit board 1, and the two ground wires 12 are disposed on and cross over the corresponding one of the perforations 11, respectively. The two clamping structures 22 of the casing 2 penetrate through the corresponding one of the perforations 11, and ground with the corresponding one of the ground wires 12, respectively. Consequently, the rapid ground operation is performed, the circuit board 1 is positioned on the casing 2, and the advantages of reducing costs and saving assembly time are achieved.

Please refer to FIG. 1 and FIG. 2. In the present embodiment, the first casing part 2a and the second casing part 2b of the casing 2 are assembled with each other to close the accommodating space 23, so as to prevent dust or water from entering the interior of the electronic device 100. In an embodiment, the second casing part 2b includes a top plate 24 and a plurality of lateral plates 25. The plurality of lateral plates 25 are respectively disposed adjacent to each other, and are respectively connected with the top plate 24. The plurality of lateral plates 21 of the first casing part 2a are connected to the plurality of lateral plates 25 of the second casing part 2b, correspondingly and respectively, so that the first casing part 2a is assembled with the second casing part 2b. It is note that the plurality of lateral plates 21 of the first casing part 2a and the plurality of lateral plates 25 of the second casing part 2b are connected to each other, for example but not exclusively, by means of clipping or locking.

Please refer to FIG. 2, FIG. 3 and FIG. 5A. In the embodiment, the perforation 11 of the circuit board 1 is an elongated opening having two long sides 11a, but not limited thereto. The ground wire 12 linearly crosses over the perforation 11. Two ends of the ground wire 12 are in connection with the circuit board 1 and disposed adjacent to the two long sides 11a of the perforation 11, respectively. An angle θ is formed between the ground wire 12 and the long side 11a of the perforation 11. The angle θ is an acute angle. Preferably, the angle θ is between 30 degrees and 60 degrees. More preferably, the angle θ is 45 degrees. Since the angle θ between the ground wire 12 and the long side 11a of the perforation 11 is an acute angle, when the clamping structure 22 is in contact with the ground wire 12 of the circuit board 1, the stress generated therein is smaller, and the fracture of the ground wire 12 is avoided.

Please refer to FIG. 2, FIG. 4 and FIG. 5B. In the present embodiment, the first clamping part 221 and the second clamping part 222 of the clamping structure 22 of the casing 2 has a clamping space 223 therebetween. The clamping space 223 has an opening segment 223a, a clamping segment 223b and a buffering segment 223c. The opening segment 223a is at a free end of the clamping space 223, the buffering segment 223c is at a close end of the clamping space 223, and the clamping segment 223b is in communication between the opening segment 223a and the buffering segment 223c. When the circuit board 1 is disposed in the accommodating space 23 of the casing 2 and the clamping structures 22 penetrates through the corresponding one of perforations 11 of the circuit board 1, the ground wire 12 of the circuit board 1 enters the clamping space 223 through the opening segment 223a, and is disposed in the clamping segment 223b. The buffering segment 223c is configured to provide a space for elastic deformations of the first clamping part 221 and the second clamping part 222, so as to prevent the first clamping part 221 and the second clamping part 222 from being damaged by the stress generated by contacting the plate body 10 or the ground wire 12 of the circuit board 1. In the present embodiment, the distance between the first clamping part 221 and the second clamping part 222 at the buffering segment 223c is greater than that at the clamping segment 223b, but not limited thereto.

In the present embodiment, the first clamping part 221 has a first inclined part 221a. The first inclined part 221a is disposed corresponding to the opening segment 223a of the clamping space 223. The second clamping part 222 has a second inclined part 222a. The second inclined part 222a is disposed corresponding to the opening segment 223a of the clamping space 223. The distance between the first clamping part 221 and the second clamping part 222 is tapered from the free end of the opening segment 223a toward the clamping segment 223b. The distance between the first clamping part 221 and the second clamping part 222 at the opening segment 223a is greater than that at the clamping segment 223b, but not limited thereto. When the circuit board 1 is disposed in the accommodating space 23 of the casing 2 and the clamping structures 22 penetrates through the corresponding one of perforations 11 of the circuit board 1, the ground wire 12 of the circuit board 1 enters the clamping space 223 from the opening segment 223a along the first inclined part 221a of the first clamping part 221 and the second inclined part 222a of the second clamping part 222. Consequently, the ground wire 12 of the circuit board 1 is easier to be assembled to the clamping space 223, and the damage of the clamping structure 22 caused by mechanical error is avoided.

In an embodiment, the clamping structure 22 includes a supporting part 224. The supporting part 224 is in connection with the first clamping part 221 and the second clamping part 222. As shown in FIG. 5B, when the circuit board 1 is disposed in the accommodating space 23 of the casing 2, the supporting part 224 is disposed between the bottom plate 20 of the casing 2 and the plate body 10 of the circuit board 1, and a first space B is formed between the bottom plate 20 and the plate body 10. Through the arrangement of the first space B, components or devices can be disposed on two opposite surfaces of the plate body 10 of the circuit board 1. For example, the electronic device 100 includes an insolation pad (not shown), an adhesive layer (not shown) and a plurality of electronic components (not shown), and the insulation pad, the adhesive layer and the plurality of electronic components are disposed in the first space B, but not limit thereto.

In the present embodiment, the width of the supporting part 224 is greater than the width of the perforation 11. The plate body 10 includes a first surface 101 and a second surface 102. The first surface 101 and the second surface 102 are two opposite surfaces of the plate body 10. When the circuit board 1 is disposed in the casing 2, the first clamping part 221 and the second clamping part 222 of the clamping structures 22 of the casing 2 penetrate through the perforation 11 of the circuit board 1 and expose from the first surface 101 of the plate body 10 of the circuit board 1, a part of the supporting part 224 is in contact with the second surface 102 of the plate body 10 of the circuit board 1, so as to support the circuit board 1 and prevent the components from damage due to the stress generated by assembly.

Figure 6A:
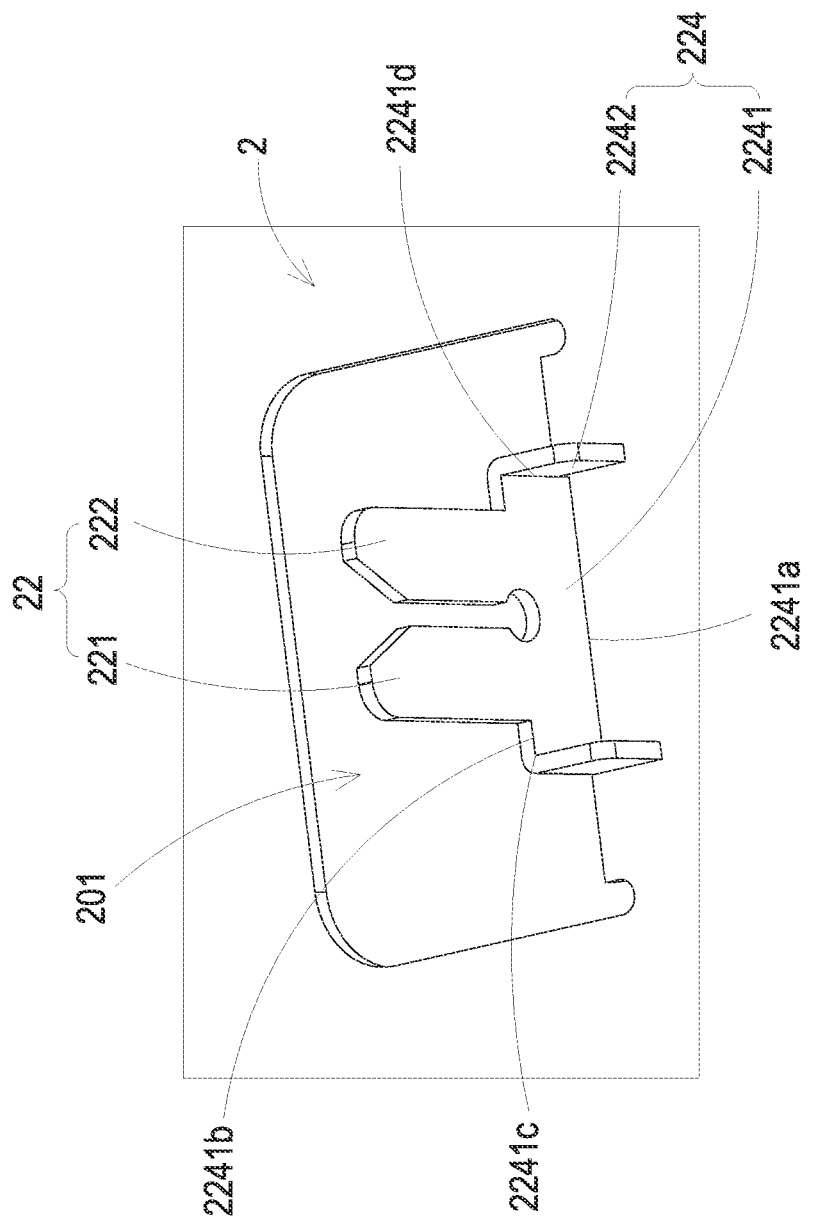
FIG. 6A is a schematic view showing a second exemplary clamping structure of the electronic device of FIG. 2.
Figure 6B:
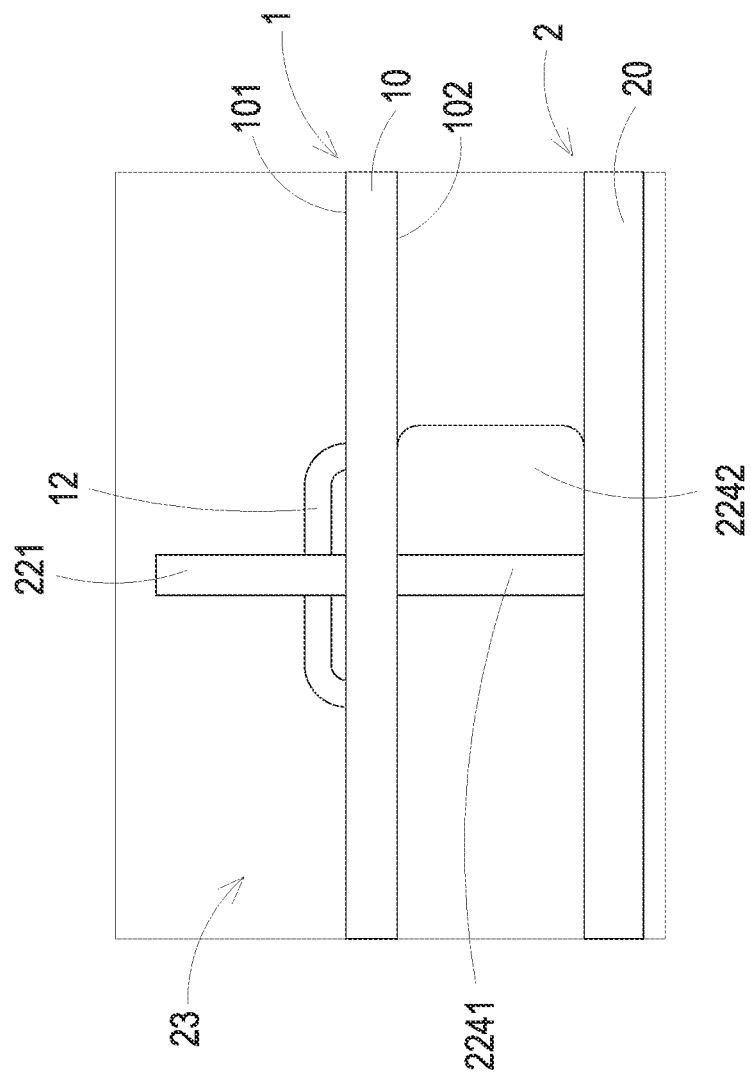
FIG. 6B is a partial side schematic view showing the circuit board of the electronic device being assembled with the casing of FIG. 6A.

FIG. 6A is a schematic view showing a second exemplary clamping structure of the electronic device of FIG. 2, and FIG. 6B is a partial side schematic view showing the circuit board of the electronic device being assembled with the casing of FIG. 6A. In an embodiment, the supporting part 224 of the clamping structure 22 of the casing 2 includes a main body 2241 and at least one first auxiliary supporting member 2242. The main body 2241 has a first side 2241a, a second side 2241b, a third side 2241c and a fourth side 2241d. The first side 2241a and the second side 2241b are two opposite sides of the main body 2241. The first side 2241a of the main body 2241 is in connected with the bottom plate 20 of the casing 2. The third side 2241c and the fourth side 2241d are two opposite sides of the main body 2241, and disposed between the first side 2241a and the second side 2241b, respectively. In the embodiment, the supporting part 224 includes two first auxiliary supporting members 2242, but not limited thereto. The number and arrangement of the first auxiliary supporting members 2242 are adjustable according to practical requirements. The two first auxiliary supporting members 2242 are in connection with the third side 2241c and the fourth side 2241d of the main body 2241 and extend toward a first direction from the main body 2241, respectively. The height of the two first auxiliary supporting members 2242 are equal to the length of the third side 2241c and the fourth side 2241d of the main body 2241, but not limited thereto. Preferably, the first direction is perpendicular to the surface of the main body 2241, but not limited thereto. When the circuit board 1 is disposed in the accommodating space 23 of the casing 2, the first auxiliary supporting members 2242 are disposed between the plate body 10 of the circuit board 1 and the bottom plate 20 of the casing 2, and are in contact with the second surface 102 of the plate body 10 of the circuit board 1, so as to support the circuit board 1 and prevent the components from damage due to the stress generated by assembly. In the present embodiment, the first auxiliary supporting members 2242 are formed by bending from the main body 2241. In other words, the first auxiliary supporting members 2242 and the main body 2241 are formed by partial materials of the bottom plate 20 which is cut and bent toward the accommodating space 23. The main body 2241, the first auxiliary supporting member 2242 and the bottom plate 20 are integrally formed into one-piece structure, so that the advantages of reducing costs and materials are achieved.

Figure 7A:
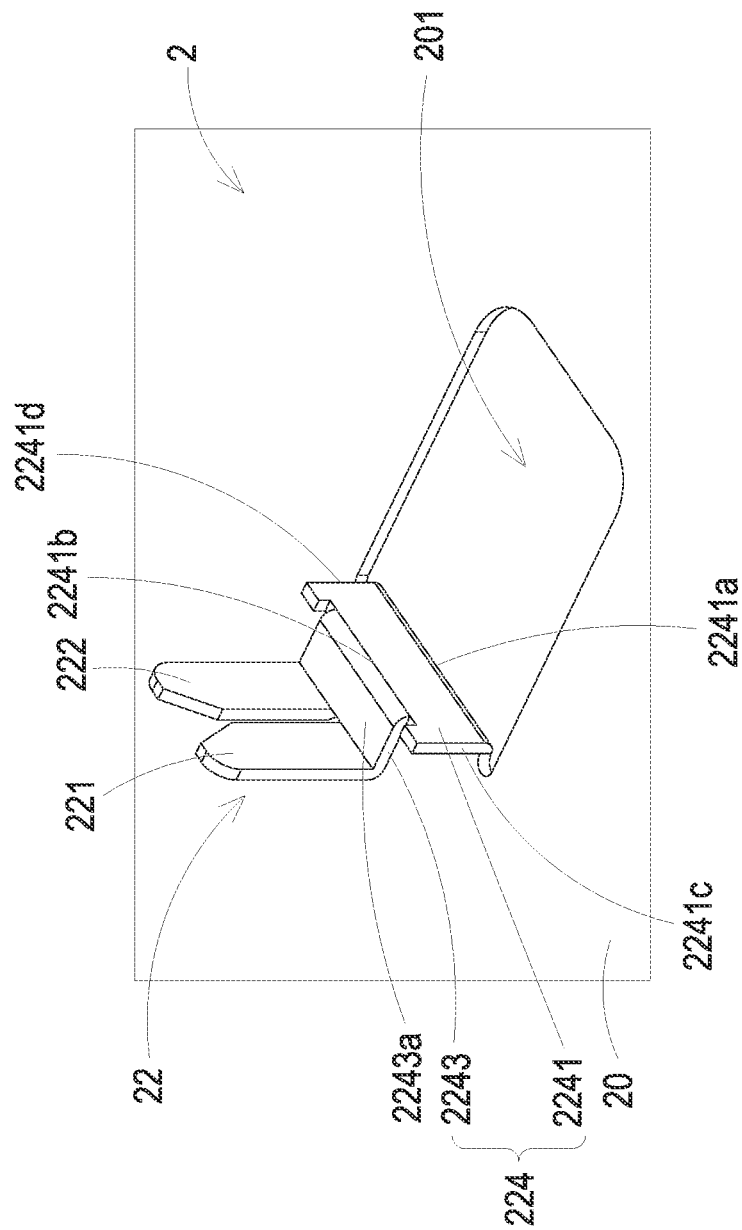
FIG. 7A is a schematic view showing a third exemplary clamping structure of the electronic device of FIG. 2.
Figure 7B:
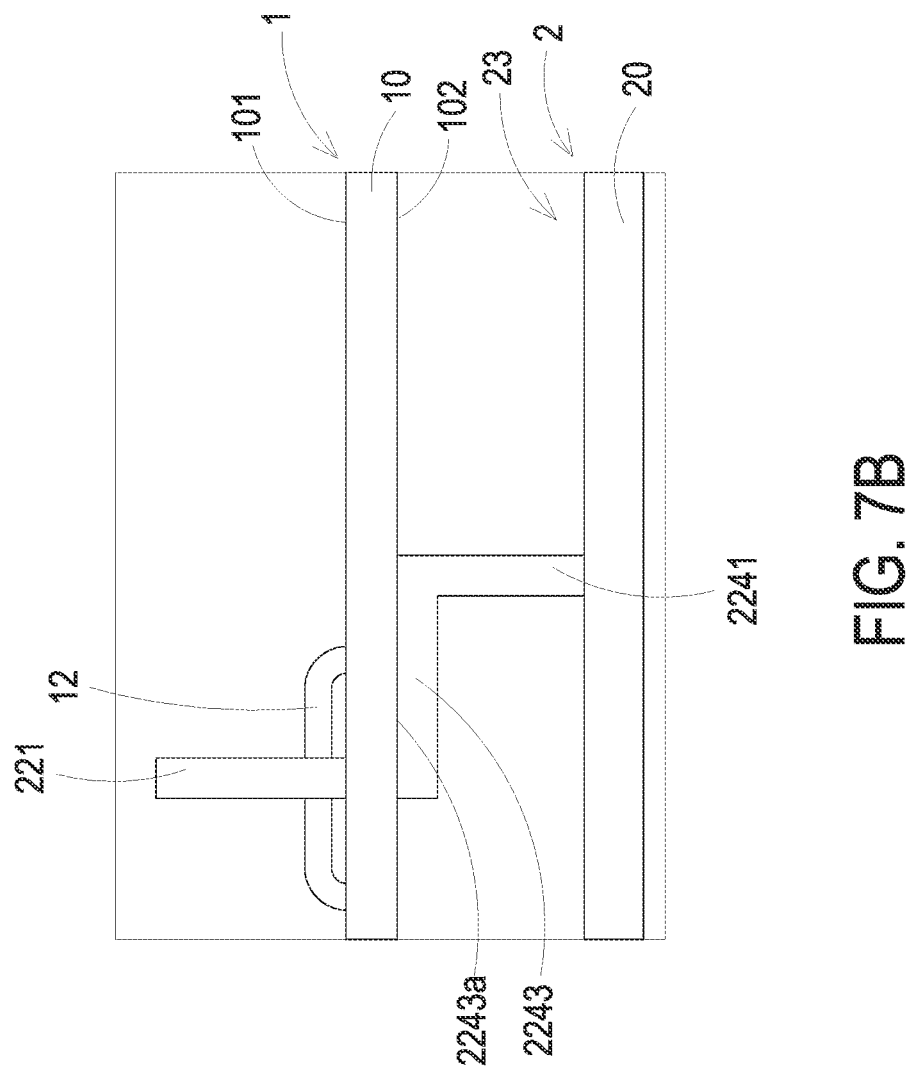
FIG. 7B is a partial side schematic view showing the circuit board of the electronic device being assembled with the casing of FIG. 7A.

FIG. 7A is a schematic view showing a third exemplary clamping structure of the electronic device of FIG. 2, and FIG. 7B is a partial side schematic view showing the circuit board of the electronic device being assembled with the casing of FIG. 7A. In an embodiment, the supporting part 224 of the clamping structure 22 includes a main body 2241 and a second auxiliary supporting member 2243. The main body 2241 has a first side 2241a, a second side 2241b, a third side 2241c and a fourth side 2241d. The second auxiliary supporting member 2243 is in connection with the second side 2241b of the main body 2241 and extends toward a second direction from the main body 2241. Preferably, the second direction is perpendicular to the surface of the main body 2241 or parallel to the surface of the circuit board 1, but not limited thereto. The second auxiliary supporting member 2243 has a contact surface 2243a. When the circuit board 1 is disposed in the accommodating space 23 of the casing 2, the contact surface 2243a of the second auxiliary supporting member 2243 is in contact with the second surface 102 of the plate body 10 of the circuit board 1, so as to increase the contact area to the plate body 10 of the circuit board 1, support the circuit board 1 and prevent the components from damage due to the stress generated by assembly. In the present embodiment, the second auxiliary supporting member 2243 is in connection among the first clamping part 221, the second clamping part 222 and the main body 2241. The first clamping part 221 and the second clamping part 222 are perpendicularly in connection with a side of the second auxiliary supporting member 2243. The main body 2241 is perpendicularly in connection with another side of the second auxiliary supporting member 2243. The first clamping part 221 and the second clamping part 222 are bent from a side of the second auxiliary supporting member 2243. The second auxiliary supporting member 2243 is bent from the second side 2241b of the main body 2241. In other words, the first clamping part 221, the second clamping part 222, the second auxiliary supporting member 2243, the main body 2241 and the bottom plate 20 are integrally formed into one-piece structure, so that the advantages of reducing costs and materials are achieved.

Figure 8A:
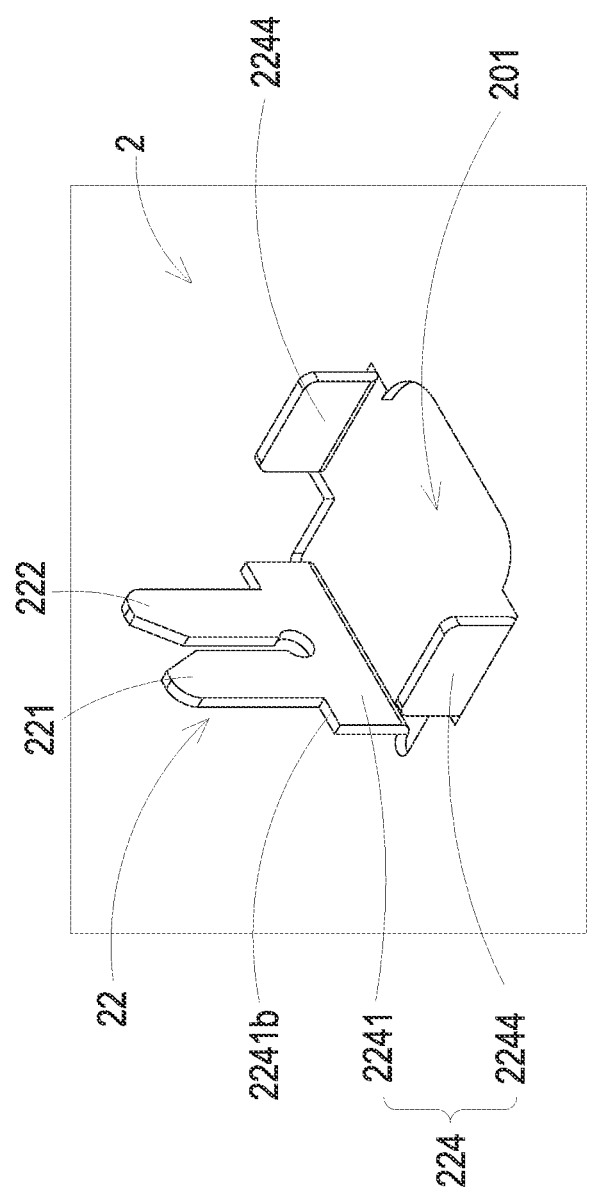
FIG. 8A is a schematic view showing a fourth exemplary clamping structure of the electronic device of FIG. 2.
Figure 8B:
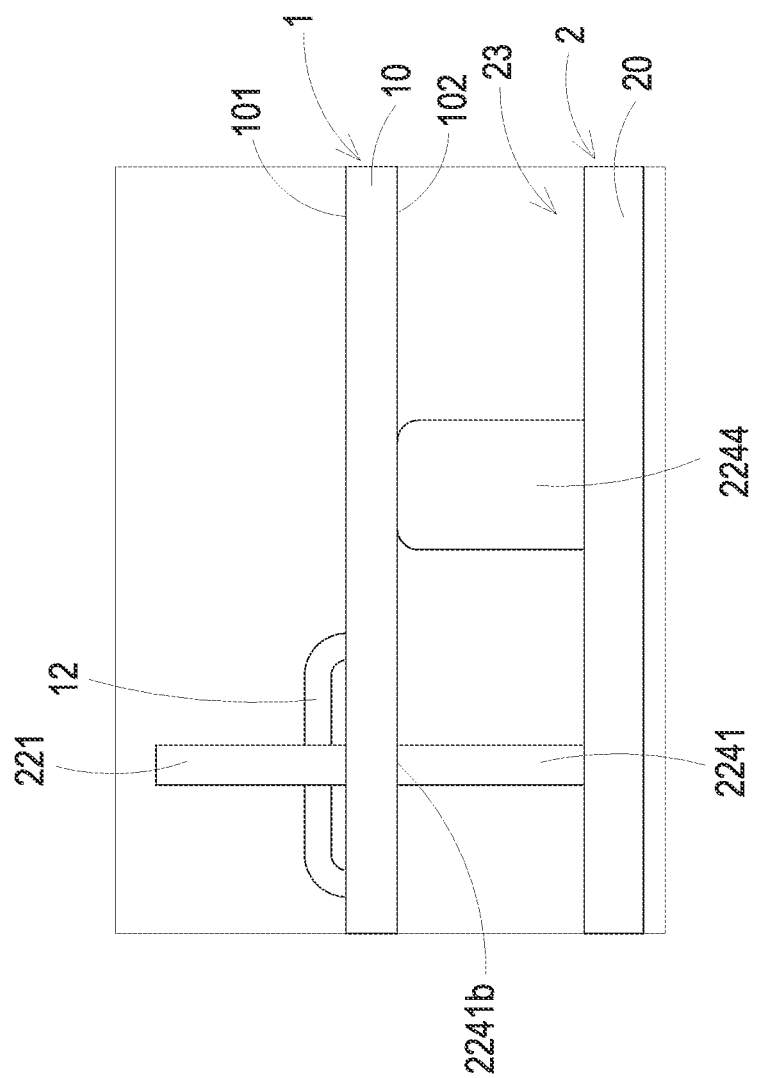
FIG. 8B is a partial side schematic view showing the circuit board of the electronic device being assembled with the casing of FIG. 8A.

FIG. 8A is a schematic view showing a fourth exemplary clamping structure of the electronic device of FIG. 2, and FIG. 8B is a partial side schematic view showing the circuit board of the electronic device being assembled with the casing of FIG. 8A. In an embodiment, the supporting part 224 of the clamping structure 22 includes a main body 2241 and at least one third auxiliary supporting member 2244. The at least one third auxiliary supporting member 2244 is formed by partial materials of the bottom plate 20 which is cut and bent toward the accommodating space 23. The at least one third auxiliary supporting member 2244 is perpendicular to the bottom plate 20, but not limited thereto. In an embodiment, the at least one third auxiliary supporting member 2244 is in connection with at least one side of the opening 201 of the bottom plate 20. In the present embodiment, the supporting part 224 includes two third auxiliary supporting members 2244, but not limited thereto. The number and arrangement of the third auxiliary supporting members 2244 are adjustable according to practical requirements. The two third auxiliary supporting members 2244 are disposed apart from the main body 2241 of the supporting part 224, respectively, and are in connection with two opposite sides of the opening 201 of the bottom plate 20. The main body 2241 and the two third auxiliary supporting members 2244 are in connection with different sides of the opening 201, respectively. Distances from two free ends of the two third auxiliary supporting members 2244 to the bottom plate 20 are equal. Distance from the second side 2241b of the main body 2241 of the supporting part 224 to the bottom plate 20 is equal to the distances from two free ends of the two third auxiliary supporting members 2244 to the bottom plate 20, but not limited thereto. When the circuit board 1 is disposed in the accommodating space 23 of the casing 2, the two third auxiliary supporting members 2244 are disposed between the plate body 10 of the circuit board 1 and the bottom plate 20 of the casing 2, and are in contact with the second surface 102 of the plate body 10 of the circuit board 1. The main body 2241 and the two third auxiliary supporting members 2244 provide multiple contact areas to support the circuit board 1, so as to prevent the components from damage due to the stress generated by assembly.

In some embodiments, the supporting part 224 of the clamping structure 22 includes at least one of the first auxiliary supporting member 2242, the second auxiliary supporting member 2243 and the third auxiliary supporting member 2244, or the combination thereof, but not limited thereto. The detailed implementation is similar to that as described in the above-mentioned embodiments, and is not redundantly described hereinafter. By the arrangements of the first auxiliary supporting member 2242, the second auxiliary supporting member 2243 and the third auxiliary supporting member 2244, the circuit board 1 can be firmly supported, the contact area to the circuit board 1 is increased, and the damage of the components due to the stress generated by assembly is prevented.

From above description, the present disclosure provides an electronic device and a grounding structure thereof. The clamping structure of the casing penetrates through the perforation of the circuit board, and is in contact with the ground wire. Consequently, the rapid ground operation is performed, the circuit board is positioned on the casing at the same time, and the advantages of reducing costs and saving assembly time are achieved. The clamping structure of the present disclosure is formed by bending partial materials of the bottom plate, and the clamping structure and the bottom plate are integrally formed into one-piece structure, so that the advantages of reducing costs and materials are achieved. In addition, since the angle between the ground wire and the perforation is an acute angle, when the clamping structure is in contact with the ground wire, the stress generated therein is smaller, and the fracture of the ground wire is avoided. Moreover, by the arrangements of the auxiliary supporting members, the circuit board can be firmly supported, the contact area to the circuit board is increased, and the damage of the components due to the stress generated by assembly is prevented.

While the disclosure has been described in terms of what is presently considered to be the most practical and preferred embodiments, it is to be understood that the disclosure needs not be limited to the disclosed embodiment.

What is claimed is:

1. An electronic device comprising:
a circuit board comprising a plate body, at least one perforation and at least one ground wire, wherein the at least one perforation penetrates through the plate body, wherein two opposite ends of the at least one ground wire are electrically coupled with the plate body, and are respectively disposed adjacent to two sides of the at least one perforation, wherein the at least one ground wire is disposed on and crosses over the at least one perforation, and the at least one perforation is divided into two parts by the at least one ground wire; and
a casing comprising a bottom plate, at least one clamping structure and an accommodating space, wherein a part of the bottom plate is bent from the remaining part of the bottom plate toward the accommodating space to form the at least one clamping structure, wherein the at least one clamping structure and the bottom plate are integrally formed into one piece structure, wherein the at least one clamping structure comprises a first clamping part and a second clamping part, which are disposed apart from each other,
wherein the circuit board is disposed in the accommodating space of the casing, the at least one clamping structure of the casing penetrates through the plate body through the at least one perforation, so that the circuit board is positioned on the casing, and the at least one ground wire is clamped by the first clamping part and the second clamping part of the at least one clamping structure, so that the circuit board is grounded with the casing.

2. The electronic device according to claim 1, wherein the at least one clamping structure is formed by partial materials of the bottom plate which is bent toward the accommodating space, and an opening is formed on the bottom plate, wherein the at least one clamping structure is in connection with a side of the opening.

3. The electronic device according to claim 1, wherein the at least one clamping structure comprises a supporting part, the supporting part is in connection with the first clamping part and the second clamping part, wherein the circuit board is disposed in the accommodating space of the casing, the supporting part is disposed between the bottom plate and the plate body, and a first space is formed between the bottom plate and the plate body.

4. The electronic device according to claim 3, wherein the plate body comprises a first surface and a second surface opposite to each other, wherein the width of the supporting part is greater than the width of the at least one perforation, wherein the first clamping part and the second clamping part penetrate through the at least one perforation and expose from the first surface of the plate body, and a part of the supporting part is in contact with the second surface of the plate body.

5. The electronic device according to claim 4, wherein the supporting part comprises a main body and at least one first auxiliary supporting member, the at least one first auxiliary supporting member is in connection with the main body and extends toward a first direction from the main body, wherein the circuit board is disposed in the accommodating space of the casing, the at least one first auxiliary supporting member is disposed between the plate body and the bottom plate, and is in contact with the second surface of the plate body.

6. The electronic device according to claim 4, wherein the supporting part comprises a main body and at least one second auxiliary supporting member, the at least one second auxiliary supporting member is in connection with the main body, extends toward a second direction from the main body, and has a contact surface, wherein the circuit board is disposed in the accommodating space of the casing, and the contact surface of the second auxiliary supporting member is in contact with the second surface of the plate body.

7. The electronic device according to claim 4, wherein the supporting part comprises a main body and at least one third auxiliary supporting member, the at least one third auxiliary supporting member is formed by partial materials of the bottom plate which is bent toward the accommodating space, wherein the circuit board is disposed in the accommodating space of the casing, the at least one third auxiliary supporting member is disposed between the plate body and the bottom plate, and is in contact with the second surface of the plate body.

8. The electronic device according to claim 1, wherein the first clamping part and the second clamping part has a clamping space therebetween, and the clamping space has an opening segment, a clamping segment and a buffering segment, wherein the opening segment is at a free end of the clamping space, the buffering segment is at a close end of the clamping space, and the clamping segment is in communication between the opening segment and the buffering segment, wherein the at least one ground wire of the circuit board enters the clamping space through the opening segment, and is disposed in the clamping segment, wherein the buffering segment is configured to provide a space for elastic deformations of the first clamping part and the second clamping part.

9. The electronic device according to claim 8, wherein the first clamping part has a first inclined part, the second clamping part has a second inclined part, and the first inclined part and the second inclined part are disposed corresponding to the opening segment of the clamping space, wherein the distance between the first clamping part and the second clamping part is tapered from the free end of the opening segment toward the clamping segment.

10. The electronic device according to claim 1, wherein the at least one clamping structure and the bottom plate of the casing are made of a metal material, or the overall structure of the casing is made of the metal material.

11. The electronic device according to claim 1, wherein the casing comprises a first casing part and a second casing part, and the first casing part is detachably assembled with the second casing part, wherein the first casing part comprises the bottom plate, a plurality of lateral plates, the accommodating space, and the second casing part has a top plate and a plurality of lateral plates.

12. The electronic device according to claim 1, wherein the at least one perforation has a long side, the at least one ground wire linearly crosses over the at least one perforation, wherein an angle is formed between the at least one ground wire and the long side of the at least one perforation, and the angle is an acute angle.

13. A grounding structure for an electronic device comprising:
 a circuit board comprising a plate body, a perforation and a ground wire, wherein the perforation penetrates through the plate body, wherein two opposite ends of the ground wire are electrically coupled with the plate body, and are respectively disposed adjacent to two sides of the at least one perforation, wherein the at least one ground wire is disposed on and crosses over the perforation;
 a bottom plate; and
 a clamping structure disposed on the bottom plate, and comprising a first clamping part and a second clamping part, which are disposed apart from each other, wherein a part of the bottom plate is bent from the remaining part of the bottom plate to form the clamping structure, wherein the clamping structure and the bottom plate are integrally formed into one piece structure,
 wherein the clamping structure penetrates through the plate body through the perforation, and the ground wire is clamped by the first clamping part and the second clamping part for grounding.

14. The grounding structure according to claim 13, wherein the clamping structure comprises a supporting part, the supporting part is in connection with the first clamping part and the second clamping part, wherein the supporting part is disposed between the bottom plate and the plate body, and a first space is formed between the bottom plate and the plate body.

15. The grounding structure according to claim 14, wherein the plate body comprises a first surface and a second surface opposite to each other, wherein the width of the supporting part is greater than the width of the perforation, wherein the first clamping part and the second clamping part penetrate through the perforation and expose from the first surface of the plate body, and a part of the supporting part is in contact with the second surface of the plate body.

16. The grounding structure according to claim 15, wherein the supporting part comprises a main body and at least one first auxiliary supporting member, the at least one first auxiliary supporting member is in connection with the main body and extends toward a first direction from the main body, wherein the at least one first auxiliary supporting member is disposed between the plate body and the bottom plate, and is in contact with the second surface of the plate body.

17. The grounding structure according to claim 15, wherein the supporting part comprises a main body and at least one second auxiliary supporting member, the at least one second auxiliary supporting member is in connection with the main body, extends toward a second direction from the main body, and has a contact surface, wherein the contact surface of the second auxiliary supporting member is in contact with the second surface of the plate body.

18. The grounding structure according to claim 15, wherein the supporting part comprises a main body and at least one third auxiliary supporting member, the at least one third auxiliary supporting member is formed by partial materials of the bottom plate, wherein the at least one third auxiliary supporting member is disposed between the plate body and the bottom plate, and is in contact with the second surface of the plate body.

19. The grounding structure according to claim 13, wherein the first clamping part and the second clamping part has a clamping space therebetween, and the clamping space has an opening segment, a clamping segment and a buffering segment, wherein the opening segment is at a free end of the clamping space, the buffering segment is at a close end of the clamping space, and the clamping segment is in communication between the opening segment and the buffering segment, wherein the ground wire of the circuit board enters the clamping space through the opening segment, and is disposed in the clamping segment, wherein the buffering segment is configured to provide a space for elastic deformations of the first clamping part and the second clamping part.

20. The grounding structure according to claim 19, wherein the first clamping part has a first inclined part, the second clamping part has a second inclined part, and the first inclined part and the second inclined part are disposed corresponding to the opening segment of the clamping space, wherein the distance between the first clamping part and the second clamping part is tapered from the free end of the opening segment toward the clamping segment.

* * * * *